United States Patent
Iso (10) Patent No.: US 9,434,028 B2
(45) Date of Patent: Sep. 6, 2016

(54) SOLDERING METHOD AND METHOD OF MANUFACTURING SEMICONDUCTOR DEVICE

(71) Applicant: FUJI ELECTRIC CO., LTD., Kawasaki-shi (JP)

(72) Inventor: Akira Iso, Minami-Alps (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 76 days.

(21) Appl. No.: 14/301,425

(22) Filed: Jun. 11, 2014

(65) Prior Publication Data
US 2014/0374470 A1  Dec. 25, 2014

(30) Foreign Application Priority Data

Jun. 25, 2013 (JP) ................. 2013-132701

(51) Int. Cl.
| | | |
|---|---|---|
| B23K 1/20 | (2006.01) |
| B23K 35/12 | (2006.01) |
| B23K 35/38 | (2006.01) |
| C04B 37/00 | (2006.01) |
| C04B 37/02 | (2006.01) |
| H01L 23/373 | (2006.01) |
| H01L 21/48 | (2006.01) |

(Continued)

(52) U.S. Cl.
CPC ........... *B23K 35/383* (2013.01); *C04B 37/006* (2013.01); *C04B 37/026* (2013.01); *H01L 21/4882* (2013.01); *H01L 23/3735* (2013.01); *C04B 2235/652* (2013.01); *C04B 2237/12* (2013.01); *C04B 2237/121* (2013.01); *C04B 2237/123* (2013.01); *C04B 2237/124* (2013.01); *C04B 2237/36* (2013.01); *C04B 2237/402* (2013.01); *C04B 2237/407* (2013.01); *C04B 2237/55* (2013.01); *C04B 2237/72* (2013.01); *H01L 23/057* (2013.01); *H01L 23/3736* (2013.01); *H01L 24/48* (2013.01); *H01L 24/73* (2013.01); *H01L 25/072* (2013.01); *H01L 2224/48091* (2013.01); *H01L 2224/48137* (2013.01); *H01L 2224/48227* (2013.01); *H01L 2224/73265* (2013.01); *H01L 2924/1305* (2013.01); *H01L 2924/13055* (2013.01); *H01L 2924/19107* (2013.01)

(58) Field of Classification Search
None
See application file for complete search history.

(56) References Cited

U.S. PATENT DOCUMENTS

| 4,609,565 | A | * | 9/1986 | Yates | ........................ | C23C 28/00 |
|---|---|---|---|---|---|---|
| | | | | | | 136/256 |
| 6,021,940 | A | * | 2/2000 | Sindzingre | ............. | B23K 1/012 |
| | | | | | | 228/203 |

(Continued)

FOREIGN PATENT DOCUMENTS

| JP | 05001367 A | * | 1/1993 |
|---|---|---|---|
| JP | 05-069122 A | | 3/1993 |

(Continued)

*Primary Examiner* — Devang R Patel
*Assistant Examiner* — Carlos Gamino
(74) *Attorney, Agent, or Firm* — Rossi, Kimms & McDowell LLP (57) ABSTRACT

Provided is a soldering method through nickel plating layer to reduce void occurrence rate and a method of manufacturing semiconductor device by using the soldering method. By heating a copper base plate having a nickel plating layer at a temperature range of 300° C. to 400° C. in an inert gas atmosphere beforehand, void occurrence rate can be reduced in soldering the copper base plate to an insulating circuit board.

14 Claims, 8 Drawing Sheets

(51) Int. Cl.
*H01L 23/057* (2006.01)
*H01L 23/00* (2006.01)
*H01L 25/07* (2006.01)

(56) References Cited

U.S. PATENT DOCUMENTS 6,538,323 B1 * 3/2003 Sakata .................. H01L 23/481
257/734
6,818,543 B2 * 11/2004 Bendat .................. B23K 1/008
228/180.22
7,249,411 B2 * 7/2007 Belopolsky .......... H05K 3/3415
228/180.21

FOREIGN PATENT DOCUMENTS

JP 09-036299 A 2/1997
JP 2002-004082 A 1/2002

* cited by examiner

SOLDERING METHOD AND METHOD OF MANUFACTURING SEMICONDUCTOR DEVICE

CROSS-REFERENCE TO RELATED APPLICATION

This application claims priority from and the benefit of Japanese Application No. 2013-132701, filed Jun. 25, 2013, the entire disclosure of which is incorporated herein by reference.

BACKGROUND

1. Field of the Invention

Embodiments of the invention relate to a soldering method and a method of manufacturing a semiconductor device by using the soldering method.

2. Description of the Related Art

Figure 8:
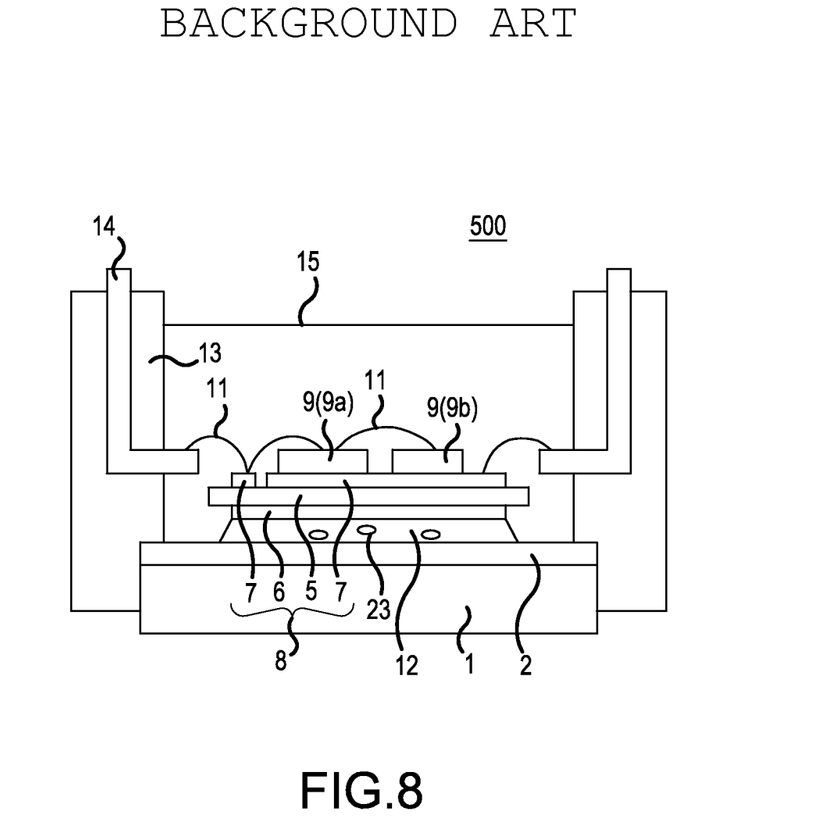
FIG. 8 is a structural view showing the configuration of a principal part of IGBT module 500.

FIG. 8 is a structural view showing the configuration of a principal part of an IGBT (Insulated Gate Bipolar Transistor) module 500. The IGBT module 500 includes a base plate 1, an insulating circuit board 8 to be solder-joined thereon, a semiconductor chip 9 (consisting of IGBT chip 9a and diode chip 9b) joined on the insulating circuit board 8, a resin case frame 13 with an external lead-out terminal 14 bonded to a base plate 1, bonding wire 11 connecting the semiconductor chip 9 to the external lead-out terminal 14 and so on, and a sealing material 15 filled in the resin case frame 13. The insulating circuit board 8 is composed of a ceramic plate 5, a copper foil 6 in the rear surface region, and a copper foil 7 in the front surface region.

In general, the base plate 1 is plated with nickel and has a nickel plating layer 2. During storage of base plate 1, however, a metal oxide film such as a nickel oxide film is frequently formed on the surface of the nickel plating layer 2. Additionally, as mentioned above, the insulating circuit board 8 comprises the copper foil 6, the ceramic plate 5, and the copper foil 7 in this order, and some of the copper foils 6 and 7 are plated with nickel or the others are not plated with nickel. Moreover, the base plate 1 is joined to the copper foil 6 of the insulating circuit board 8 with a solder 12.

Figure 9:
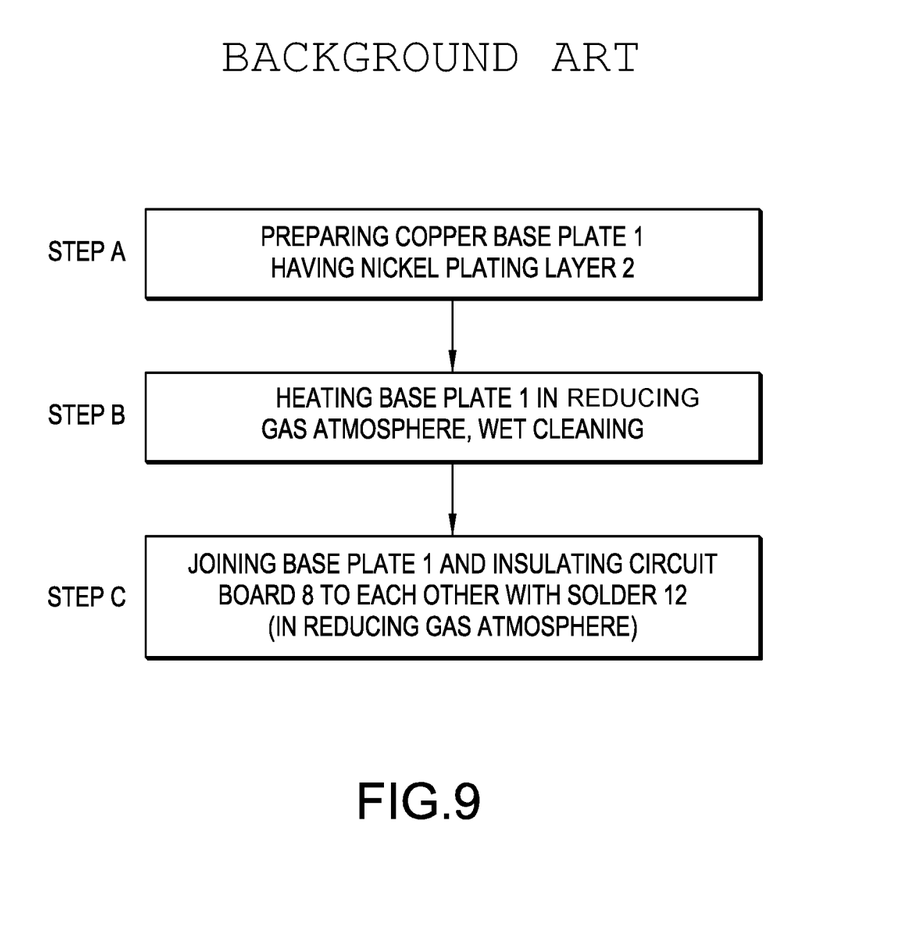
FIG. 9 is a schematic assembling flow diagram of IGBT module 500.

FIG. 9 is a schematic assembling flow diagram of the IGBT module 500.

The base plate 1 to be plated with nickel is prepared (Step A).

Next, the nickel-plated base plate 1 is heated with reducing gas (hydrogen gas), and then a nickel oxide film (metal oxide film) on the surface of the nickel plating layer 2 is reduced to be made a nickel film, and after that, a wet cleaning is provided (Step B).

Then, the base plate 1 is joined to the copper foil 6 of the insulating circuit board 8 with solder in a reducing atmosphere (Step C).

In the above-mentioned Step C, when the base plate 1 is joined to the copper foil 6 of the insulating circuit board 8, existence of the metal oxide film on the joined surface provides poor wettability of solder 12 to generate a void 23 when solder is melting. In addition, void 23 provides one of the causes leading to the failure of quality and reliability for the IGBT module 500, and a decrease in void generation is desirable.

At present, as mentioned above, it is a general method that a metal oxide film such as a nickel oxide film is reduced and changed into nickel film to be joined with solder, in a reducing gas atmosphere (hydrogen gas is usually used as reducing gas).

Additionally, there is also a method to carry out heating base plate 1 before solder joining, and at that case, it is general to carry out it reducing gas atmosphere as mentioned above.

Further, Japanese Unexamined Patent Application Publication No. H9-36299 discloses that oxide film on the surface of nickel plating film provides poor solder wettability and soldering in a reducing gas atmosphere containing hydrogen gas provides disadvantages such as complication of equipment and an increase in cost, as described below.

In addition, Japanese Unexamined Patent Application Publication No. 2002-4082 discloses that when nickel plating film is charged with hydrogen (changed into a reducing gas atmosphere) and comes into contact with a fused solder, hydrogen in the plating film makes thermal diffusion and reduces oxygen of the oxide film coating the surface to a water molecule, and consequently soldering can be performed without using a flux.

Further, Japanese Unexamined Patent Application Publication No. H5-69122 discloses that a nickel plating film is made to contain hydrogen, and a surface oxide film is reduced by hydrogen emitted from the inside of a metal by means of heat in soldering (at 220° C.), and then good soldering is possible.

SUMMARY OF THE INVENTION

Figure 3A:
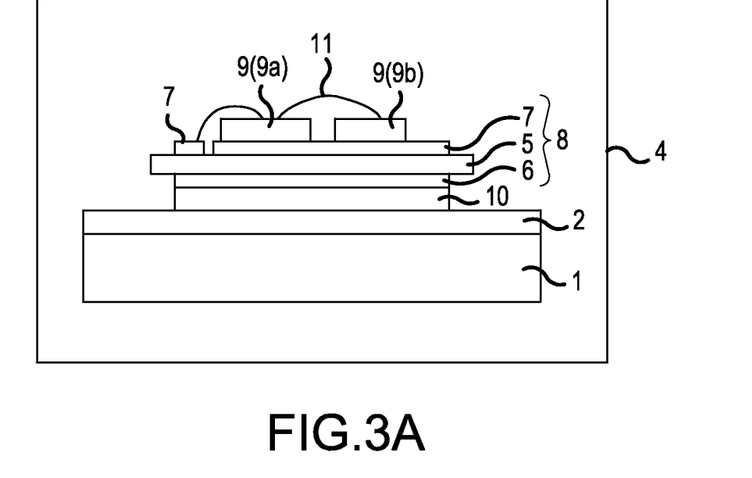
FIG. 3(A) is a process sectional view of a principal part of semiconductor device 100 set in reflow furnace according to the second embodiment of the invention, continued from FIG. 2(b).

However, as described above, a joining method by using solder 12 in a reducing gas atmosphere is performed with base plate 1, solder sheet 10, and insulating circuit board 8 stacked in this order (refer to FIG. 3(A)), so that a surface of base plate 1 stacked with solder sheet 10 is not exposed to a reducing gas atmosphere, and a joined surface to be most important for joining results in a condition to be not reduced. Therefore, nickel oxide film 21 (refer to FIG. 6(A) that is metal oxide film, remains on the joining surface, and then a void 23 is generated.

In addition, when base plate 1 is heated in a reducing gas atmosphere beforehand, hydrogen gas is generally used as mentioned above. But hydrogen gas is flammable, and so heating equipment involves explosion-proof measures and the like, which increases cost of heating equipment and peripheral equipment.

Further, Japanese Unexamined Patent Application Publication Nos. H9-36229, 2002-4082, and H5-69122 do not disclose that "a member having nickel plating layer is heated at predetermined temperature in an inert gas atmosphere beforehand; nickel oxide film on the surface of nickel plating layer is reduced and removed by hydrogen coming out of nickel plating layer through this heating; after that, the members are joined with solder."

Embodiments of the present invention solve the above-mentioned problems and provide a soldering method of lowering void incidence and a method of manufacturing semiconductor device by using the soldering method, by applying low-cost heating equipment dispensing with explosion-proof measures.

In accordance with a first aspect of the present invention, a soldering method includes a process to heat a member having nickel plating layer in a temperature range of 300° C. to 400° C. in an inert gas atmosphere and to reduce nickel oxide film on the surface of the nickel plating layer, and a process to join the member with solder in a reducing gas atmosphere.

In addition, in accordance with a second aspect of the present invention, the nickel plating layer may be formed by means of electroless plating treatment in the first aspect of the present invention.

Further, in accordance with a third aspect of the present invention, the temperature range may be 320° C. to 360 C in the first aspect of the present invention.

Additionally, in accordance with a fourth aspect of the present invention, the inert gas may be nitrogen gas or argon gas in the first aspect of the present invention.

Further, in accordance with a fifth aspect of the present invention, the method of manufacturing a semiconductor device comprises a process to heat a base plate having nickel plating layer in a temperature range of 300° C. to 400° C. in inert gas atmosphere and to reduce nickel oxide film on the surface of the nickel plating layer, and a process to join the base plate to conductive foil of insulating circuit board with solder in a reducing gas atmosphere.

In addition, in accordance with a sixth aspect of the present invention, the nickel plating film may be formed by electroless plating treatment in the fifth aspect of the present invention.

Further, accordance with a seventh aspect of the present invention, the temperature range may be 320° C. to 360° C. in the fifth of the present invention.

Additionally, in accordance with an eighth aspect of the present invention, the conductive foil may have a nickel plating layer in the fifth aspect of the present invention.

Also, in accordance with a ninth aspect of the present invention, the inert gas may be nitrogen gas or argon gas in the fifth aspect of the present invention.

Further, in accordance with a tenth aspect of the present invention, materials of the base plate may be any one of copper, aluminum, AlSiC, or MgSiC in the fifth of the present invention.

In addition, in accordance with an eleventh aspect of the present invention, the insulating circuit board may have a structure of fixing the conductive foils on both sides of a ceramic plate in the fifth of the present invention.

Also, in accordance with a twelfth aspect of the present invention, the conductive foil may be a copper foil in the fifth of the present invention.

According to embodiments of the invention, a member (base plate) having nickel plating film is heated in the temperature range of 300° C. to 400° C. in an inert gas atmosphere beforehand, whereby void occurrence rate can be reduced.

Further, because the member (base plate) is heated in an inert gas atmosphere, heating equipment does not require explosion-proof measures, and can be provided at a low cost.

DESCRIPTION OF THE ILLUSTRATED EMBODIMENTS

Some embodiments below will be described in detail with reference to the accompanying drawings. In the description of embodiments, the same symbols are given to the same component parts as conventional structure.

First Embodiment

Figure 1:
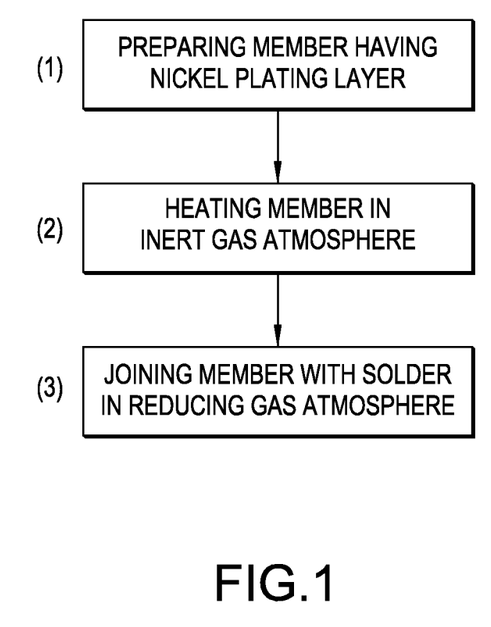
FIG. 1 is an assembling flow diagram describing soldering method according to a first embodiment of the invention.

FIG. 1 is an assembling flow diagram describing soldering method according to a first embodiment of the invention.

Nickel plated copper member (hereinafter referred to as "member") is prepared. A member including aluminum, AlSiC (aluminum silicon carbide), or MgSiC (magnesium silicon carbide) may be used instead of copper member. The nickel plating is, for example, electroless plating and treated at about 80° C. Hydrogen is included in nickel plating layer during this electroless nickel plating treatment. Therefore, it is not necessary to charge reducing gas such as hydrogen from the outside in particular. And a joined member is also prepared.

When nickel plating layer is formed by this electroless plating treatment, hydrogen gas is generated under the influence of reducing agent included in plating solution, and then mostly released outside. However, a part of hydrogen gas is incorporated into nickel crystal lattice as hydrogen atom, and hydrogen is included in nickel plating layer. In addition, the nickel plating layer is formed on the entire surface of a member, and only soldering surface is shown here that is necessary for description.

Charging hydrogen from the outside is not desirable, for example, because it may result in degrading hardness of nickel plating layer and then leading defects of crack into nickel plating layer, depending on some charging conditions.

By heating the nickel plated member at predetermined temperature in an inert gas atmosphere (such as a nitrogen gas atmosphere), hydrogen included in nickel plating layer moves to the surface and then changes surface of nickel plating layer into reducing atmosphere. By means of this reducing atmosphere, hydrogen reacts with nickel oxide film that is metal oxide film covering the surface, and the nickel oxide film is reduced and changed into nickel film. Moreover, heating in inert gas atmosphere prevents surface oxidation of nickel plating layer. Argon gas may be substituted for nitrogen gas to be used for the inert gas atmosphere.

For the prescribed temperature, the temperature range may be 300° C. to 400° C., and in some embodiments, the temperature range may be 320° C. to 380° C.

At heating temperature below 300° C., releasing-out rate of hydrogen included in nickel plating layer becomes small, and amount of hydrogen is insufficient to provide reducing atmosphere. At heating temperature over 400° C., hardness loss of nickel plating layer of the member becomes large. Further, the surface of nickel plating layer becomes rough and provides void source during soldering, which is not desirable.

Solder sheet is sandwiched between a member and a joined member joined to this member and closely attached to these members, and then the solder is melted with heating in reducing gas atmosphere (such as a hydrogen gas atmosphere). After that, by cooling off and solidifying, the two members are joined together via the solder. This solder joining may be carried out, for example, in a temperature range of 200° C. to 300° C.

In an embodiment of the invention, by producing the heating temperature described above, hydrogen in nickel plating layer can be efficiently pulled out to the surface, and the surface of nickel plating layer can be restrained from becoming rough and changed to reducing atmosphere. As a result, while preventing surface roughness of nickel plating layer, nickel oxide film on the surface of nickel plating layer can be reduced efficiently and void occurrence rate can decrease to 10% or less.

Thus, because base board is heated in an inert gas atmosphere, heating equipment does not need to apply explosion-proof measures and the like, and therefore heating equipment and peripheral equipment will not increase cost.

Second Embodiment

FIG. 2(A) to FIG. 4 show a method of manufacturing semiconductor device 100 in accordance with second embodiment of the present invention and are process sectional views of a principal part of the device in manufacturing process order.

Figure 2A:
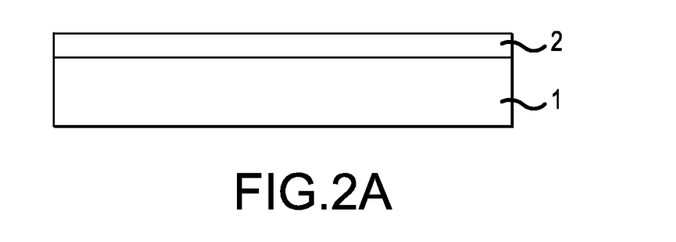
FIG. 2(A) is a process sectional view of a principal part of semiconductor device 100 according to a second embodiment of the invention.

As shown in FIG. 2(A), copper base plate 1 (hereinafter referred to as "base plate") having nickel plating layer 2 is prepared. The nickel plating may be performed using, for example, electroless plating and plating temperature of about 80° C. Further, the nickel plating layer 2, for example, has a thickness of about several hundred micrometers. Instead of nickel-plated copper base plate 1, nickel plating may be applied to base plates including aluminum, AlSiC (aluminum silicon carbide), or MgSiC (magnesium silicon carbide). In addition, nickel plating layer 2 is formed on entire surface of base plate, however, the illustrations shows only a surface joined by soldering for convenience. And an insulating circuit board 8 having a conductive copper foil 6 is also prepared.

Figure 2B:
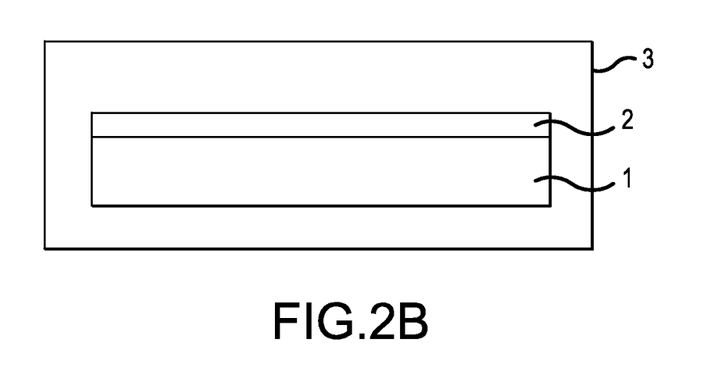
FIG. 2(B) is a process sectional view of a principal part of semiconductor device 100 set in thermostatic oven according to the second embodiment of the invention, continued from FIG. 2(a).

Next, as shown in FIG. 2(B), base plate 1 having nickel plating layer 2 is heated at a temperature range of 300° C. to 400° C., or in some embodiments, in a range of 320° C. to 380° C., in an inert gas atmosphere (such as nitrogen gas atmosphere), for example, by using thermostatic oven 3. This heating treatment reduces nickel oxide film 21 on the surface of nickel plating layer 2 to nickel film (see FIGS. 6(A) to 6(C)). Thus, heating in an inert gas atmosphere eliminates the need for explosion-proof measures of the thermostatic oven 3 used as heating equipment.

Next, as shown in FIG. 3(A), solder sheet 10 is sandwiched between base plate 1 and copper foil 6 on insulating circuit board 8, melted in a reducing gas atmosphere (such as a hydrogen gas atmosphere) and solidified afterwards, and then nickel plating layer 2 is fixed (to be soldered) to copper foil 6 through solder 12. This solder joining is carried out, for example, by using reflow furnace 4 in a temperature range of 200° C. to 300° C. The insulating circuit board 8, for example, comprises a structure that copper foils 6 and 7 (or aluminum foil) are fixed onto both sides of ceramic plate 5. Further, one copper foil 7 is fixed to semiconductor chip 9 and the other copper foil 6 is joined onto the base plate 1 with solder. Both of semiconductor chips 9($a$) and 9($b$) are connected to each other with bonding wire 11, and the chip 9($a$) is connected to copper foil 7 with bonding wire 11. Nickel plating is applied to the copper foils 6 and 7. The nickel plating in this case may be performed using, for example, electroless plating and plating temperature of about 80° C.

Figure 3B:
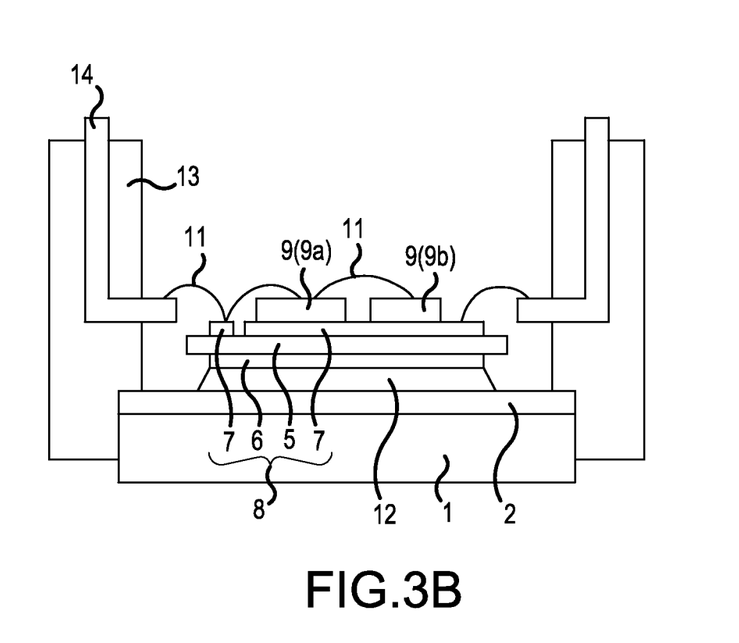
FIG. 3(B) is a process sectional view of a principal part of semiconductor device 100 arranged in resin case frame according to the second embodiment of the invention, continued from FIG. 3(B).

Next, as shown in FIG. 3(B), base board 1 is fixed onto resin case frame 13 having external lead-out terminal 14 by adhesive. After that, semiconductor chip 9 and external lead-out terminal 14 are connected to each other by bonding wire 11.

Figure 4:
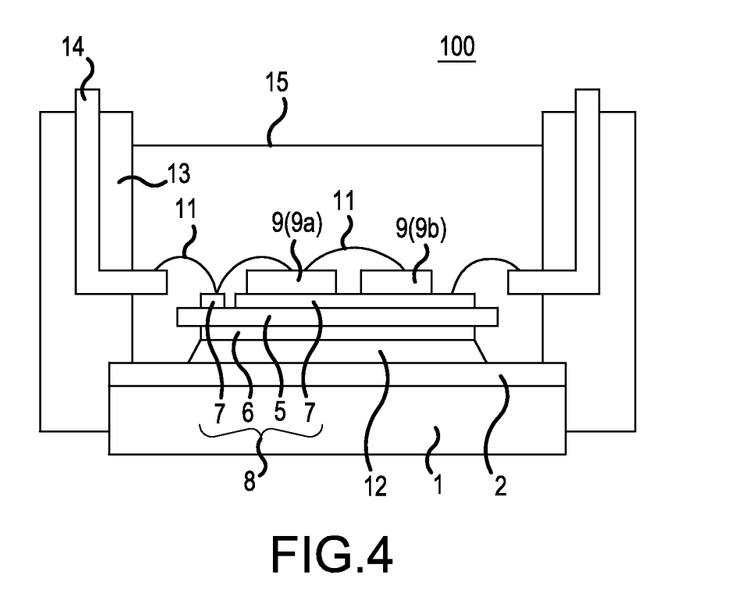
FIG. 4 is a process sectional view of a principal part of semiconductor device 100 according to the second embodiment of the invention, continued from FIG. 3(B).

Next, as shown in FIG. 4, by coating on the inside of resin case frame 13 with sealing material, assembly of semiconductor device 100 is completed.

As mentioned above, by heating in an inert gas atmosphere and reducing nickel oxide film 21 on the surface of nickel plating layer 2 formed on base plate 1 beforehand, a rate of void occurrence can be greatly restrained in the subsequent soldering process.

Moreover, while heating is carried out in inert gas atmosphere, it is not necessary to conduct explosion-proof measures on thermostatic oven used as heating equipment, and therefore cost reduction can be promoted for heating equipment and peripheral equipment.

Figure 5:
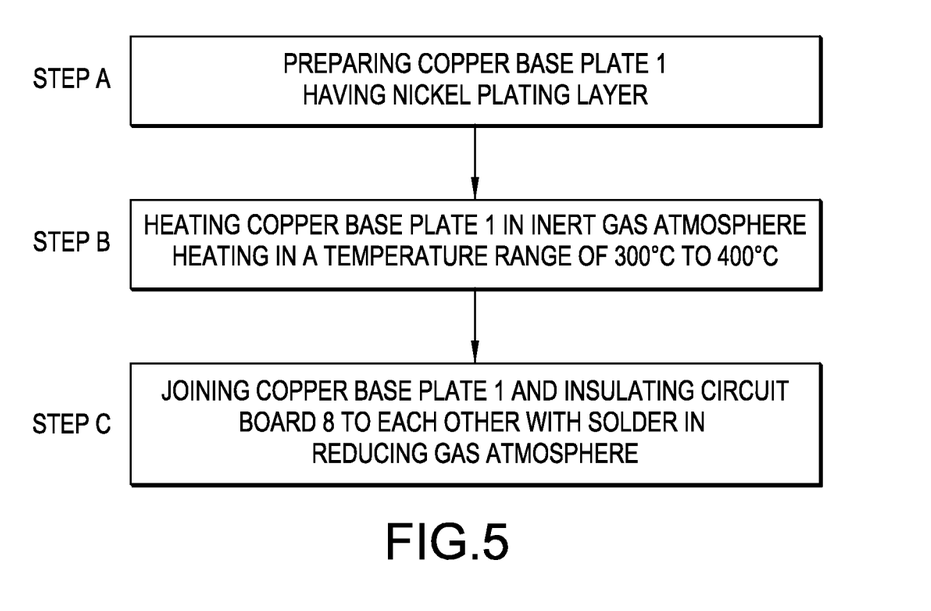
FIG. 5 is a schematic flow diagram of heating in an inert gas atmosphere on manufacturing method of semiconductor device shown in FIG. 2(A) to FIG. 4.

FIG. 5 is a schematic flow diagram of heating in inert gas atmosphere on manufacturing method of semiconductor device shown in FIG. 2(A) to FIG. 4.

In Step A, base plate 1 having nickel plating layer 2 is prepared. Next, in Step B, base plate 1 is heated in an inert gas atmosphere. And in Step C, nickel plating layer 2 of base plate 1 is solder-joined to copper foil 6 of insulating circuit board 8, coated by nickel plating layer not shown in the figure.

Figure 6A:
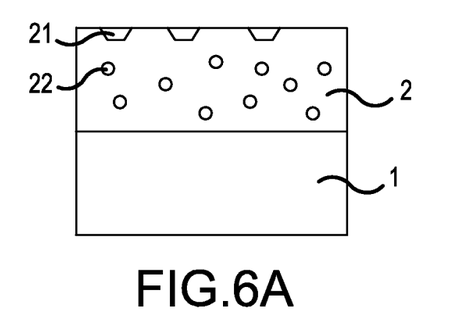
FIG. 6(A) is a schematic view showing that hydrogen 22 exists in nickel plating layer 2, relating to a removal mechanism of nickel oxide film 21 formed on nickel plating layer 2.
Figure 6B:
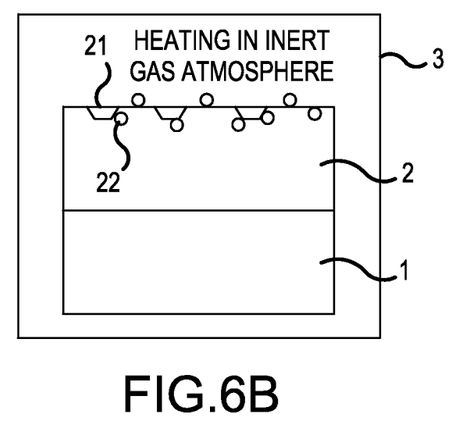
FIG. 6(B) is a schematic view showing that hydrogen 22 is attracted to nickel oxide film 21 by heating in an inert gas atmosphere and nickel oxide film 21 is reduced, relating to the above removal mechanism.
Figure 6C:
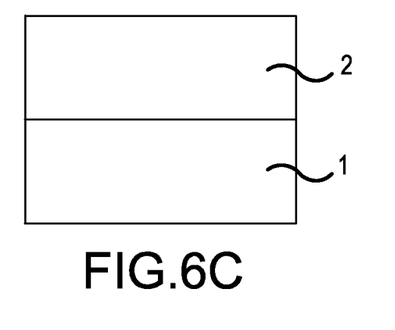
FIG. 6(C) is a schematic view showing that nickel oxide film 21 has been removed, relating to the above removal mechanism.

FIG. 6(A), FIG. 6(B), and FIG. 6(C) are schematic views describing a mechanism that nickel oxide film 21 formed on nickel plating layer 2 is reduced to change into nickel film. FIG. 6(A) is a schematic view showing that hydrogen 22 exists in nickel plating layer 2; FIG. 6(B) is a schematic view showing that hydrogen 22 is attracted to nickel oxide film 21 by heating in inert gas atmosphere and nickel oxide film 21 is reduced; and FIG. 6(C) is a schematic view showing that nickel oxide film 21 has changed into nickel film.

By heating base plate 1 in a temperature range of 300° C. to 400° C., or in a range of 320° C. to 380° C., and in an inert gas atmosphere, hydrogen 22 included inside nickel plating layer 2 on the surface of base plate 1 may be substantially eliminated. Eliminated hydrogen 22 acts as reducing gas and reduces nickel oxide film 21, which is metal oxide film on the surface of base plate 1 to make moisture, without using reducing gas. By evaporation of this moisture, nickel oxide film 21 becomes nickel film.

Figure 7:
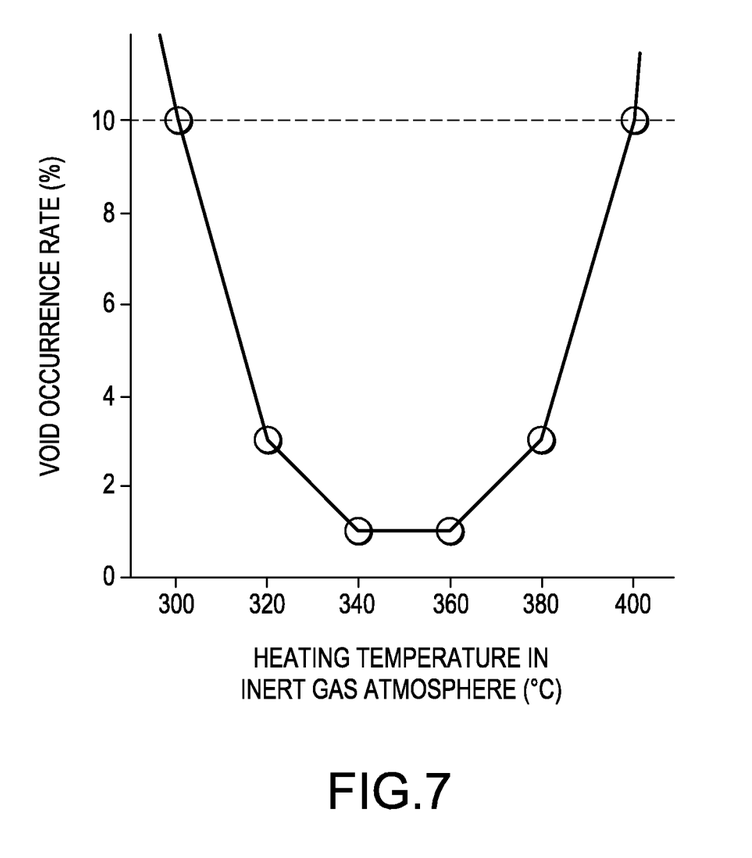
FIG. 7 is a graph showing void occurrence rate to be examined by X-ray imaging.

FIG. 7 is a graph showing void occurrence rate to be examined by X-ray imaging. A horizontal axis indicates heating temperature, and a vertical axis indicates void occurrence rate. This figure is a graph showing the relation between void occurrence rate and heating temperature, when base plate 1 has been joined to insulating circuit board 8 with solder after heating base plate 1 in an inert gas atmosphere beforehand. Void occurrence rate has been calculated by performing image processing of the point right under semiconductor chip 9. Nickel plating is applied to the base plate 1 and also to copper foil 6 of insulating circuit board 8. In addition, the effect nearly similar to the above is obtained even if nickel plating is not applied to the above copper foil 6.

When heating has not been performed in an inert gas atmosphere, void occurrence rate may reach 90%, whereas when base plate 1 is heated in the temperature range of 300° C. to 400° C. in an inert gas atmosphere (e.g. in nitrogen gas atmosphere) and thereafter joined to insulating circuit board 8 with solder 12, the void occurrence rate can be improved to 10% or less. Additionally, by heating in the temperature range of 320° C. to 380° C., void occurrence rate can be reduced to 3% or less. Further, by heating in the temperature range of 340° C. to 360° C., void occurrence rate can be reduced to 1%.

When the above heating temperature exceeds 400° C., hardness of nickel plating layer 2 is lowered and a surface of nickel plating layer 2 begins to be roughened, whereby void occurrence rate exceeds 10% at temperatures of over 400° C. Therefore, void occurrence rate of 10% or less may be obtained with the heating temperature of 400° C. or less.

What is claimed is:

1. A soldering method comprising:
   heat treating a member having a nickel plating layer including hydrogen in a heat treating temperature range of 300° C. to 400° C. in an inert gas atmosphere, thereby reducing a nickel oxide film on a surface of the nickel plating layer;
   disposing a solder between the heat-treated member and a joined member; and
   joining the heat-treated member to the joined member with the solder in a reducing gas atmosphere at a second temperature lower than the heat treating temperature.

2. The soldering method according to claim 1, wherein the nickel plating layer is formed by electroless plating treatment.

3. The soldering method according to claim 1, wherein the heat treating temperature range is 320° C. to 360° C.

4. The soldering method according to claim 1, wherein the inert gas is nitrogen gas or argon gas.

5. The soldering method according to claim 1, wherein the second temperature is in a temperature range of 200° C. to 300° C.

6. A method of manufacturing a semiconductor device comprising:
   heat treating a base plate having a nickel plating layer including hydrogen in a heat treating temperature range of 300° C. to 400° C. in an inert gas atmosphere, thereby reducing a nickel oxide film on a surface of the nickel plating layer;
   disposing a solder between the heat-treated base plate and an insulating circuit board; and
   joining the heat-treated base plate to a conductive foil of the insulating circuit board with the solder in a reducing gas atmosphere at a second temperature lower than the heat treating temperature.

7. The method of manufacturing a semiconductor device according to claim 6, wherein the nickel plating layer is formed by electroless plating treatment.

8. The method of manufacturing a semiconductor device according to claim 6, wherein the heat treating temperature range is 320° C. to 360° C.

9. The method of manufacturing a semiconductor device according to claim 6, wherein the conductive foil has a nickel plating layer.

10. The method of manufacturing a semiconductor device according to claim 6, wherein the inert gas is nitrogen gas or argon gas.

11. The method of manufacturing a semiconductor device according to claim 6, wherein the base plate comprises copper, aluminum, AlSiC, or MgSiC.

12. The method of manufacturing a semiconductor device according to claim 6, wherein the insulating circuit board comprises a ceramic plate with conductive foils disposed on both sides of the ceramic plate.

13. The method of manufacturing a semiconductor device according to claim 6, wherein the conductive foil is a copper foil.

14. The method of manufacturing a semiconductor device according to claim 6, wherein the second temperature is in a temperature range of 200° C. to 300° C.

\* \* \* \* \*